United States Patent
Clark

(10) Patent No.: US 6,794,631 B2
(45) Date of Patent: Sep. 21, 2004

(54) THREE-TERMINAL AVALANCHE PHOTODIODE

(75) Inventor: William R. Clark, Tyngsboro, MA (US)

(73) Assignee: Corning Lasertron, Inc., Bedford, MA (US)

( * ) Notice: Subject to any disclaimer, the term of this patent is extended or adjusted under 35 U.S.C. 154(b) by 0 days.

(21) Appl. No.: 10/165,472

(22) Filed: Jun. 7, 2002

(65) Prior Publication Data
US 2003/0226952 A1 Dec. 11, 2003

(51) Int. Cl.[7] .................................................. H01L 31/00
(52) U.S. Cl. ...................... 250/214.1; 257/17; 257/186
(58) Field of Search ...................... 250/214.1; 257/186, 257/17

(56) References Cited

U.S. PATENT DOCUMENTS

| 4,212,019 A | | 7/1980 | Wataze et al. ................. 357/13 |
| 4,323,911 A | | 4/1982 | Campbell et al. ............. 357/30 |
| 4,794,439 A | | 12/1988 | Webb et al. ................... 357/30 |
| 5,179,430 A | | 1/1993 | Torikai ........................ 257/186 |
| 5,308,995 A | * | 5/1994 | Tsuji et al. .................... 257/17 |
| 5,324,959 A | * | 6/1994 | Nakamura et al. ............ 257/17 |
| 5,369,292 A | * | 11/1994 | Yoo et al. .................... 257/186 |
| 5,543,629 A | | 8/1996 | Nakamura et al. ............ 257/21 |
| 5,703,379 A | | 12/1997 | Le Person et al. ............ 257/21 |
| 5,763,903 A | | 6/1998 | Mandai et al. .............. 257/186 |
| 5,866,936 A | | 2/1999 | Hasnain et al. ............. 257/452 |
| 5,942,771 A | | 8/1999 | Ishimura .................... 257/184 |
| 6,072,201 A | | 6/2000 | Fang et al. ................. 257/186 |
| 6,104,047 A | | 8/2000 | Watanabe .................... 257/186 |
| 6,147,391 A | | 11/2000 | Bowers et al. ............. 257/458 |
| 6,218,684 B1 | | 4/2001 | Kuhara et al. .............. 257/184 |
| 6,229,162 B1 | * | 5/2001 | Watanabe .................... 257/186 |
| 6,417,528 B1 | * | 7/2002 | Bond ........................ 257/186 |
| 6,664,573 B2 | * | 12/2003 | Kim et al. ................... 257/186 |

FOREIGN PATENT DOCUMENTS

| EP | 0012585 A1 | 12/1979 |
| EP | 1069626 A2 | 1/2001 |
| JP | 09184499 | 6/1998 |
| WO | WO 98/00873 | 1/1998 |

\* cited by examiner

*Primary Examiner*—Thanh X. Luu
*Assistant Examiner*—Stephen Yam
(74) *Attorney, Agent, or Firm*—Juliana Agon

(57) ABSTRACT

An avalanche photodiode (APD) includes an absorption layer above the multiplication layer, where the thickness of the multiplication layer is defined through a growth process. The APD can also have a third-terminal, or peripheral ring terminal, for collecting charge carriers generated outside the optically-active region of the device. Undesirable dark current can thus be better managed during the life of the device. The three-terminal design may also be utilized in other photodetectors, including PIN diodes.

20 Claims, 6 Drawing Sheets

THREE-TERMINAL AVALANCHE PHOTODIODE

BACKGROUND OF THE INVENTION

Avalanche photodiodes (APDs) are widely employed in high-speed communication systems. For optical receiver applications, for instance, APDs are preferred over many other candidate photodetectors, including PIN diodes, particularly due to their high internal gain characteristics and improved signal-to-noise ratio.

Generally, APDs utilize a region of semiconductor material for receiving incident photons within an appropriate spectral range (for example, 1.2 $\mu$m<$\lambda$<1.6 $\mu$m), and generating charge carriers in response to the incident light. The generated charge carriers are accelerated towards opposite electrodes by a large applied reverse-bias. At least some of the charge carriers are accelerated into a second region of a high-field semiconductor material where the carriers gain sufficient energy to initiate impact ionization, and hence avalanche multiplication.

One typical APD structure is shown in FIG. 1. This planar, multilayer structure comprises an absorption layer 302, for receiving incident light and creating electrons and holes through the photogeneration process, and a multiplication layer 301, where the avalanche multiplication occurs. These devices may be formed on a semiconductor substrate 300 (such as an n+-type InP wafer). In this example, the absorption layer 302 (e.g. undoped InGaAs) is formed directly above the substrate, followed by, in succession, one or more grading layers 306 (e.g. InGaAs) for grading the band-gap between the absorption and multiplication regions, a thin dose layer 305 (e.g. ~1000 Angstrom-thick n+-type InP) doped to a very specific areal dose, and the multiplication layer 301 (e.g. undoped InP).

Commonly, a p-type dopant (e.g. Zinc) is added into the structure through diffusion or ion-implantation techniques to form a p-n junction near the surface of the device. As shown in FIG. 1, the thickness of the multiplication layer 301 is determined by the depth to which the p-type dopant diffuses into the device.

Using conventional diffusion or ion implantation techniques, the depth of the diffusion region 303, and thus the thickness of the multiplication layer 301, can be controlled with a generally acceptable degree of accuracy. Typically, the thickness of a multiplication layer 301 defined through diffusion can be controlled to within ∀ 500 Angstoms. This is a satisfactory degree of control for APDs with a sufficiently thick multiplication layer (i.e. >4 $\mu$m). However, this technique may not be accurate enough to produce reliable, high-performance APDs with very thin multiplication layers.

Also shown in FIG. 1 is guard ring 304, which is a second diffused region of a p-type dopant that surrounds the periphery of the diffusion region 303. In an APD, ideally the region of highest gain should be the central, optically active region of the device (i.e. at the planar interface between the diffusion region and the multiplication layer). However, due to the curvature at the periphery of the diffusion region 303, the highest fields are often produced at the edges, rather than the center of the optically active region. The guard ring helps to suppress undesirable edge-breakdown by effectively eliminating the curved periphery of the diffusion region. Although, with the addition of the guard ring, there is a tradeoff in that the overall area of the device, and thus its capacitance, is increased.

Also, because of the relatively large reverse bias (-25V) applied across the p- and n-electrodes, there is typically a large dark current produced in the conventional APD, which negatively effects performance and can shorten the useful lifetime of the device.

SUMMARY OF THE INVENTION

An avalanche photodiode (APD) which comprises a semiconductor substrate, an undoped multiplication layer above the substrate, a thin dose layer over the multiplication layer, and an undoped absorbing layer located above the multiplication and dose layers. The APD can additionally comprise p- and n-electrodes for applying a reverse bias across the layers of the device. In operation, incident photons are received in the absorbing layer, which generates charge carriers. At least some charge carriers are accelerated into the multiplication layer, where they gain enough energy to initiate impact ionization, and thus avalanche multiplication.

The multiplication layer is defined through a conventional epitaxial growth process, such as metalorganic chemical vapor deposition (MOCVD) or molecular beam epitaxy (MBE). The thickness of the multiplication layer is preferably determined by a relatively controllable and well-understood growth process, rather than by diffusion or ion implantation techniques. The thickness of the multiplication layer is thus controllable to within about ∀ 50 Angstroms. APDs with thin multiplication layers may be reliably produced, including layers less than 4 $\mu$m thick, such as a 2 $\mu$m or 1 $\mu$m-thick multiplication layer.

By designing the APD to have a particularly thin multiplication layer, the statistical distribution of carrier gains may be advantageously narrowed. An APD characterized by low noise and high gain bandwith (GBW) product can thus be produced.

The multiplication layer can comprise any suitable semiconductor material, preferably lattice matched to the APD substrate. The dose layer can comprise this same material that is doped to a very specific areal dose. According to one embodiment, the multiplication layer and dose layer comprise InAlAs.

In one exemplary embodiment, the APD of the present invention comprises a multilayer structure, having, in succession, an n-type substrate, an n-type buffer layer, an n-type field stop layer, an undoped multiplication layer, a p-type dose layer, one or more grading layers, an undoped absorption layer, one or more grading layers, an undoped passivation layer, and a p-type contact layer. The p-side electrode forms an electrical connection with the contact layer, and the n-side electrode forms an electrical connection with either the substrate or buffer layer.

According to one aspect, the second set of grading layers (i.e. between the absorption layer and the passivation layer) is eliminated, and a p-type dopant, such as zinc, is diffused through the surface of the device and at least partially into the absorption layer.

According to another aspect, a three-terminal photodiode device comprises a semiconductor structure having an active region of semiconductor material that receives incident light and generates charge carriers in response to the light. The device also includes a contact layer of a semiconductor material located above the active region, the contact layer comprising a central region and a peripheral region, where the peripheral region is separate from, and concentrically surrounds the central region. The device further includes two electrodes for applying a voltage across the active region, one of these electrodes being in electrical connection with the central region of the contact layer, and a third electrode that is in electrical contact with the peripheral region of the contact layer.

In an APD, for instance, the third electrode comprises a drain-ring disposed on the periphery of the p-side electrode. The drain ring is located outside of the optically active region of the APD. This third electrode can collect charge carriers generated outside of the optically active region of the device.

The present invention also relates to a three-terminal p-type-intrinsic-n-type (PIN) diode having a contact layer comprised of a central region and a peripheral region. The device additionally includes two terminals (electrodes), one of which is electrically connected to the central region of the contact layer, for applying a voltage across the active regions of the device, and a third terminal that is electrically connected to the peripheral region of the contact layer.

The three-terminal structure enables at least some of the Adark current@ generated in the photodiode to be drained off by the third terminal, resulting in a less noisy device. When properly biased, this peripheral terminal can help to manage the dark current over the entire life of the device.

A method for fabricating an APD includes providing a semiconductor substrate, forming an undoped multiplication layer above the substrate, forming a thin dose layer over the multiplication layer, and forming an undoped absorbing layer above the multiplication and dose layers. Each of the multiplication layer, dose layer, and absorbing layer can be fabricated using a known epitaxial growth process, such as metalorganic chemical vapor deposition, or molecular beam epitaxy. In certain embodiments, the multiplication layer is grown to a substantially uniform thickness of approximately 4 $\mu$m or less. The thickness of the multiplication layer can also be controlled to within approximately 50 Angstroms.

A method for fabricating a three-terminal photodiode includes providing a semiconductor structure having an active region of semiconductor material that receives incident light and generates charge carriers in response to the light, and forming a contact layer of a semiconductor material above the active region, the contact layer comprising a central region and a peripheral region. The peripheral region is separate from, and concentrically surrounds the central region. A pair of electrodes can also be provided for applying a voltage across the active region of the device, where one of the electrodes is electrically connected to the central region of the contact layer. A third electrode can also be provided in electrical contact with the peripheral region of the contact layer.

Figure 1:
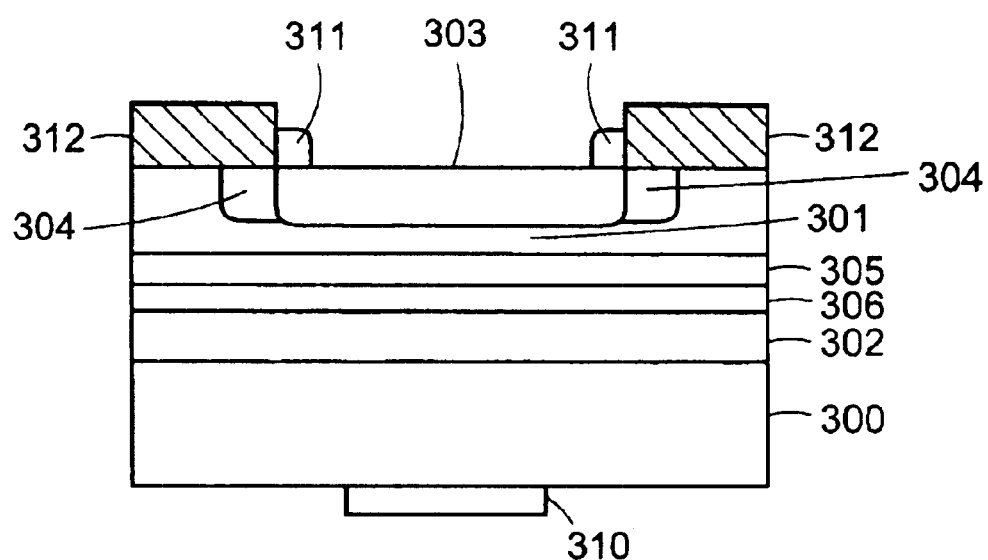
FIG. 1 is a cross-sectional schematic of a conventional APD with a p-type diffusion region which defines the thickness of the multiplication layer.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 2:
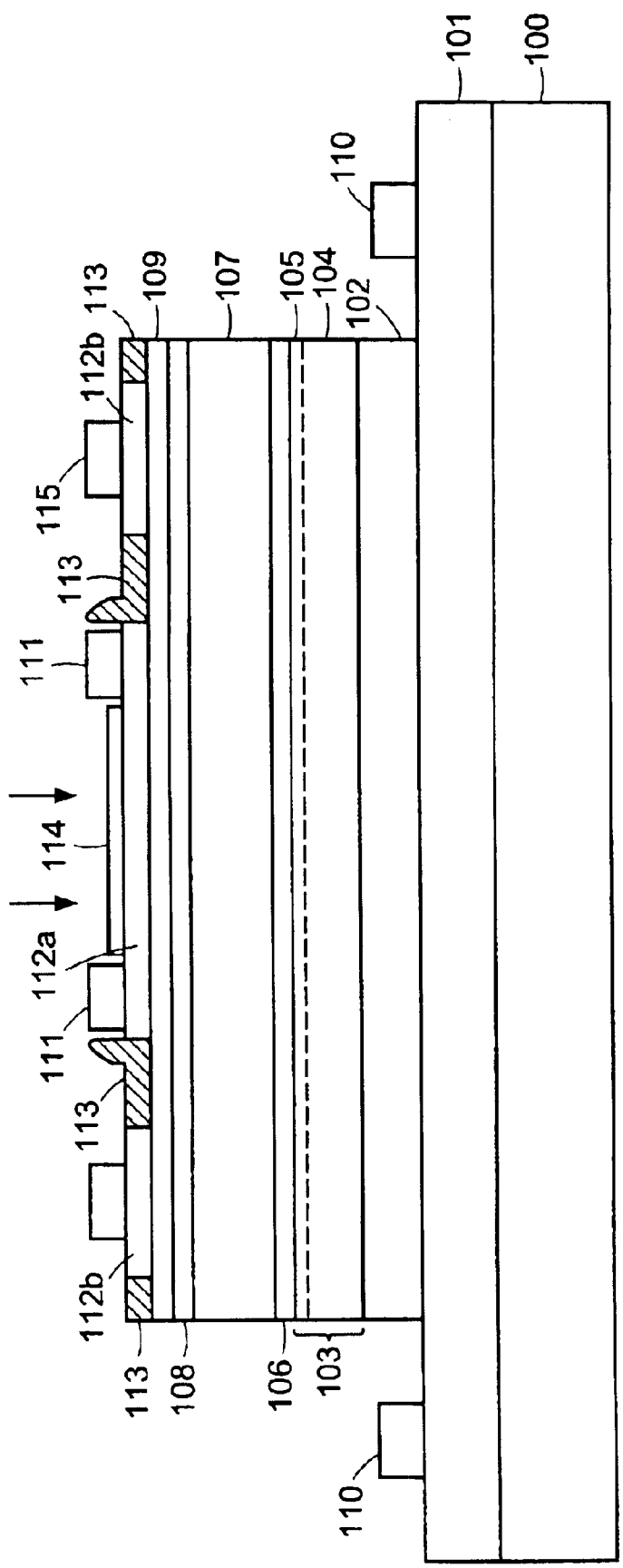
FIG. 2 is a cross-sectional schematic of an avalanche phododiode (APD) according to the present invention.

FIG. 2 is a cross-sectional schematic of an avalanche photodiode (APD) according to one embodiment of the present invention. The APD generally comprises a multilayer structure constructed on a semiconductor substrate 100. In the exemplary embodiment illustrated in FIG. 2, the substrate is n+-type indium phosphide (InP). An InP buffer layer 101 is grown over the substrate. The buffer layer comprises heavily doped (e.g., >$5 \times 10^{18}$ cm$^{-3}$) n+-type InP, and provides a highly conductive material between the n-side of the active part of the device and the n-metal contact 110.

In various embodiments, the doping concentration of the substrate 100 can vary from semi-insulating to highly doped. When the substrate has a high doping concentration, the n-side contact 100 can be made directly to the substrate layer 100, as opposed to the buffer layer 101, as shown here.

Disposed over the InP buffer layer of FIG. 2 is an indium aluminide arsenide (InAlAs) field stop layer 102. This layer comprises heavily doped (e.g., >$5 \times 10^{18}$ cm$^{-3}$) n+type InAlAs that is lattice matched to the InP substrate. This layer is located adjacent to the multiplication region of the device, and provides a depletion stop at the n-side of the active portion of the device.

Above the field stop layer is the multiplication region 103 of the diode. This region comprises two layers: a multiplication layer 104 of an undoped semiconductor material that is preferably lattice matched to the substrate, and, over the multiplication layer, a thin dose layer 105 of the semiconductor material that is p-doped to a very specific a real dose (e.g., approx. $2 \times 10^{16}$ cm$^{-3}$). The thickness of the multiplication layer, as well as the thickness and doping concentration of the dose layer, are defined through the growth process used to fabricate the APD.

In the embodiment shown in FIG. 2, the multiplication layer 104 and the dose layer 105 comprise InAlAs that is lattice matched to the InP substrate. Other materials could also be employed for the multiplication and dose layers, including InP and InGaAs. It will be appreciated that if InP is used for the multiplication region, the dopants in the structure of FIG. 2 would be reversed (i.e. all p-type become n-type, and vice versa), as the alpha/beta ratio (i.e. ratio of electron ionization rate and hole ionization rate) is opposite for InP and InAlAs.

Above the multiplication region are the grading layer(s) 106. In general, there is a relatively large band-gap discontinuity between the absorption region, where the charge carriers (holes and electrons) are generated, and the multiplication region where the carriers initiate avalanche multiplication. Accordingly, one or more grading layers may be necessary to grade the band-gap between the absorption and multiplication layers and facilitate the transfer of charge carriers between these two regions. In the present example, the grading layers 106 comprise two thin layers of indium gallium aluminum arsenide (InGaAlAs) disposed between the multiplication region 103 and the absorption layer 107.

Above the grading layers is the absorption layer 107 of the APD. During operation, incident illumination is absorbed in this region, and holes and electrons are created through the photogeneration process. In general, the absorption layer comprises a material that is lattice matched to the substrate, and also characterized by a relatively low band-gap energy, particularly in relation to the multiplication region. In the embodiment illustrated in FIG. 2, for example, the absorption layer comprises undoped indium gallium arsenide (InGaAs).

Ideally, the APD is designed such that the absorption layer is held at a low electric field (typically below about 100 kV/cm) during operation. This helps to prevent band-to-band tunneling, as well as impact ionization, from occurring within the boundaries of the absorption layer. At higher electric fields, both of these phenomena can contribute to an overall degradation in the performance of the device.

In the embodiment shown in FIG. 2, located above the absorption layer 107 is a second series of grading layers 108 for grading the band-gap between the absorption material and a passivation region 109. In the exemplary embodiment, an undoped series of five indium gallium arsenide phosphide (InGaAsP) layers are disposed between the InGaAs absorption layer 107 and the InP passivation layer 109 in order to grade the band-gap between these two layers, and facilitate or speed up the transfer of carriers (particularly holes) between these regions.

The passivation layer 109, located above the grading layers 108, is a thin layer for supporting the passivation of the p-n junction at the surface of the diode. In the present example, the passivation layer comprises an undoped InP layer. Being a binary semiconductor with a relatively large band-gap, it is more easily passivated, and thus results in lower surface current.

Above the passivation layer 109 is the contact layer 112 of the APD, comprising a heavily doped region (e.g., $>1\times10^{18}$ cm$^{-3}$) of a p+-type material. The contact layer acts as the depletion stop at the p-side of the active region. It also facilitates making an ohmic p-contact with the p-metal electrode 111 since it is heavily doped and of slightly lower band-gap energy than InP. In the central, or active, region of the device, the contact layer is where the holes are eventually collected. In the periphery of the device, the contact layer can collect undesirable dark current, as discussed in further detail below.

The p+-type contact layer 112 of FIG. 2 is InGaAs. Other materials could also be used, such as a quarternary InGaAsP layer.

According to the embodiment shown FIG. 2, the contact layer comprises two separate regions: a central region 112a, and a peripheral region 112b separated by a dielectric material 113. This configuration may be formed by etching the unnecessary portions of the contact layer 112 to define the central and peripheral regions of the contact layer, and then depositing the dielectric material 113 in the etched regions. Suitable dielectric materials include SiN and SiO$_2$.

Figure 3:
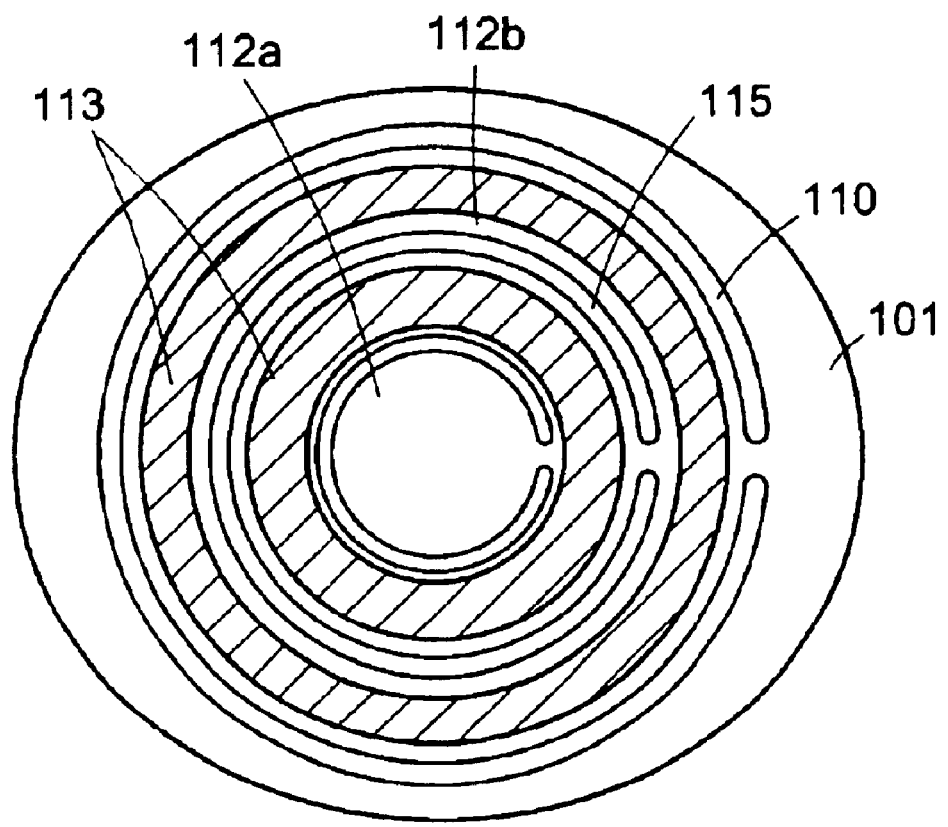
FIG. 3 is a top view of the APD of FIG. 2.

FIG. 3 is a top view of the device, showing the central region 112a concentrically surrounded by a peripheral ring 112b of the contact layer material. The central region 112a of the contact layer is where the incident light enters the APD, and thus defines the optically active area of the device. The central region 112a additionally provides the contact for the p-metal electrode 111, which in this case, may be a Ti/PtAu metal ring electrode. The optically active area may be additionally coated with anti-reflective film 114, as shown in FIG. 2.

In the APD shown in FIGS. 2 and 3, the layers above the InP substrate and buffer form a mesa structure, and the n-side contact, also a metal ring electrode 110, is deposited around the mesa. In alternative embodiments, the n-metal electrode may be located on the underside of the InP substrate.

In operation, a large reverse bias (−25 V) is applied across the p- and n-electrodes. As incident light enters the active region of the device, charge carriers are produced in the absorption layer 107. Because of the large reverse bias, the generated charge carriers are swept towards opposite electrodes. Under normal operation, electrons are accelerated towards the multiplication region 103, and holes are swept up towards the p-doped contact layer 112.

Ideally, the charge carriers gain enough energy in the narrow, very high electric field multiplication region to undergo impact ionization, and thus avalanche multiplication. It is advantageous if the multiplication region possesses a relatively large differential in the impact ionization rates of electrons and holes. $K_{eff}$ is defined as the ratio between the electron ionization rate, $\alpha$, and hole ionization rate, $\beta$, i.e. $K_{eff}=\alpha/\beta$, or $\beta/\alpha$ depending on the material at issue. In either case, $K_{eff}$ for the multiplication region is preferably substantially less than unity, which indicates that one carrier type, either holes or electrons, will undergo impact ionization at a much higher rate relative to the other. This will help reduce the noise in the APD device, as noise is proportional to $K_{eff}$ of the multiplication region.

For InP, for instance, which is a material commonly used for the multiplication region of APDs, $K_{eff}=\alpha/\beta$, and in bulk InP is approximately equal to 0.42.

InAlAs, which is employed in the embodiment shown in FIGS. 2 and 3, has a $K_{eff}=\beta/\alpha$, which for bulk InAlAs is approximately equal to 0.30.

Selecting a material with a low $K_{eff}$ will also help improve the gain-bandwidth (GBW) product, and ultimately the bit rate, of the APD device, as GBW is proportional to $1/K_{eff}$. InP-based multiplication layers are generally limited to a GBW product of up to about 180 GHz. InAlAs-based multiplication layers, on the other hand, can achieve a GBW product of approximately 290 GHz.

Ideally, the multiplication layer in the APD device should be made as thin as possible. A thin multiplication layer will narrow the statistical distribution of the carrier gains, improving both the $K_{eff}$ ratio and the GBW product, and also decreasing the overall noise in the device.

In the embodiment of FIG. 2, for instance, the thickness of the multiplication layer is approximately 0.4 $\mu$m. In some cases, it may be desirable to have a thinner multiplication layer, such as a 0.2 $\mu$m, or even a 0.1 $\mu$m layer.

One advantage of the present invention relative to prior APDs is that, according to the present invention, the thickness of the multiplication layer is defined using a well-understood and highly-controllable growth process, such as metal-organic chemical vapor deposition (MOCVD) or molecular beam epitaxy (MBE), and not through a less controllable and predictable post-growth processes, such as selective diffusion or ion implantation. In one conventional APD structure, an example of which is shown in FIG. 1, the InP multiplication layer 301 is located above the absorption layer 302, near the surface of the device. The APD is formed by growing an undoped InP layer, and then diffusing p-type dopants (Zn, for instance), into the InP layer to create a p-InP diffusion layer 303. The thickness of the multiplication layer is defined negatively, rather than positively, as the portion of the InP layer which does not contain diffused p-type dopants.

The APD of the present invention provides for more accurate control over the thickness of the multiplication layer, as the layer thickness is positively defined during the growth process. In general, according to the present invention, the thickness of the multiplication layer may be controlled to better than 50 Angstroms.

The planar design of the present APD also obviates the necessity for a guard ring 304, as shown in FIG. 1. In many conventional APD structures, the guard ring is provided (typically by diffusion or ion implantation techniques) to surround the p-InP diffusion region 303, and help suppress edge breakdown at the curved portions of the p-InP diffusion region 303. In the APD of the present invention, there are no curved portions of excessively high field in the active layers of the device, and in general, the highest gains can be achieved in the central, optically active, region of the device.

The thickness and doping characteristics of the dose layer 105 of the present APD is also defined through an epitaxial growth process. In general, this layer is much thinner than the adjacent multiplication layer 104, and is typically about 0.05 $\mu$m thick. Together, the multiplication layer 104 and the dose layer 105 define the multiplication region 103 of the APD, and are instrumental in defining the relative electric field distribution throughout the device. Consequently, accurate control over the layer thickness and impurity concentration within both of the layers constituting the multiplication region is important.

For instance, it is desirable that the multiplication region is a region of relatively high field strength, for it is here that the charge carriers must gain enough energy to initiate impact ionization and avalanche multiplication. On the other hand, the lower band-gap absorption layer 107 must be kept at a much lower field in order to suppress tunneling and impact ionization within the region. Generally, this requires an electric field below about 100 kV/cm. The APD device of FIG. 2 can achieve a high field strength in the multiplication layer, (600 kV/cm, for instance), yet also maintains a sufficiently low field in the absorption layer.

Accurate control over the thickness of the absorption layer 107 is also desirable. For optical receiver applications, for instance, the bit-rate capability of the APD is dependent on the thickness of the absorption layer. For a 10 Gbit/s receiver, for instance, the thickness of the absorption layer should be approximately 1 $\mu$m. For 40 Gbit/s, the thickness should be approximately 0.5 $\mu$m.

Regarding the other layers shown in the exemplary APD of FIG. 2, the contact layer 112 and the passivation layer 109 are approximately 0.1 $\mu$m thick, the upper grading layers 108 are approximately 0.05 $\mu$m thick in total, the lower grading layers 106 are also about 0.05 $\mu$m thick, and the field stop layer 102 can be anywhere from 0.3 to 2 $\mu$m thick.

During operation, the APD is subjected to a relatively large reverse bias (−25V), and there is thus usually a substantial amount of dark current that flows in the device when there is no incident radiation. High levels of dark current tend to make the APD noisy, and may shorten the useful life of the device.

In FIG. 2, the APD additionally comprises a third electrode 115 on the periphery of the p-side of the APD which can help to manage and control the undesirable dark current during the life of the device. This peripheral electrode 115 may comprise a metal ring electrode, similar to the p-metal electrode 111, as illustrated in FIG. 3. The peripheral electrode 115 is electrically coupled to the peripheral region of the contact layer 112b. Current generated outside of the peripheral contact 112b (e.g. at the side wall of the etched mesa) can be collected by this contact, as opposed to the active area contact 112a. The peripheral contact thus controls the amount of undesirable dark current in the active region by Asweeping@ away holes generated in the periphery of the device. The peripheral ring electrode 115 acts to drain off this undesirable current, helping to keep the dark current (and consequently, the noise) low in the central, optically active region of the device.

Figure 4:
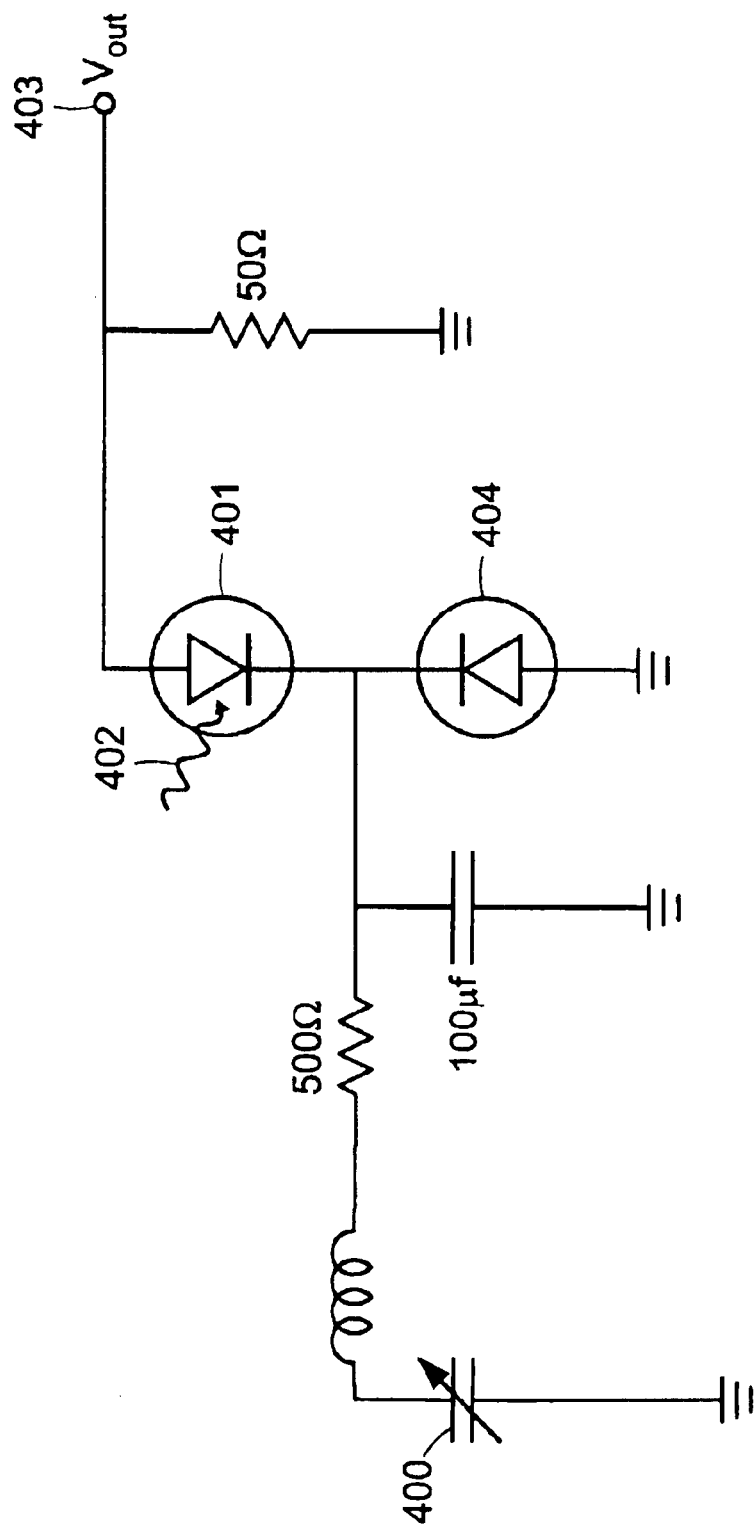
FIG. 4 is a schematic of a biasing circuitry for an APD according to the present invention.

By biasing the peripheral diode appropriately in the receiver circuitry, the dark current in the active region of the device can actually be managed over the life of the device, which is usually about twenty-five years. In general, the bias on the peripheral ring 115 is the same as the bias on the central (active) region. However, only the active region is ac coupled. FIG. 4 illustrates one possible biasing arrangement, showing the bias supply 400, central (or Aactive@) diode 401, which receives incident light 402 and produces a detectable signal 403 in response thereto, and peripheral diode 404 which Adrains off@ dark current generated in the periphery of the APD.

The peripheral ring electrode 115 may also be tapped and monitored from time-to-time over the life of the device to gage the amount of dark current present in the APD. The receiver circuitry may also be adjusted to actively control the current collected in the peripheral ring.

Figure 5:
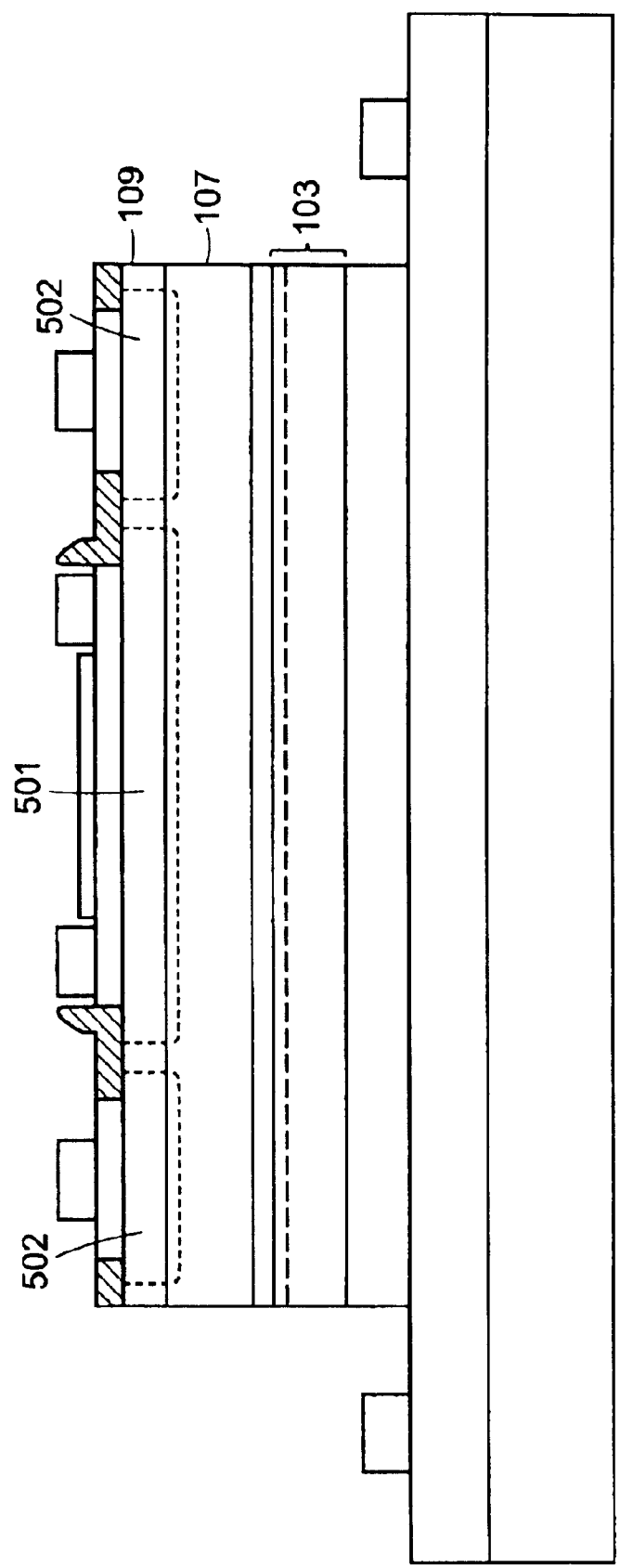
FIG. 5 is a cross-sectional schematic of an alternative APD structure according to the present invention.

An alternative design for the APD of the present invention including p-type diffusion regions 501, 502 is shown in FIG. 5. This device is similar to the APD of FIGS. 2 and 3. However, according to this variant, the InGaAsP grading layers 108 are not included. Instead, a p-type dopant (such as Zinc) is diffused through the InP passivation layer 109 and a short depth into the InGaAs absorption layer 107, forming a typically well-passivated p-n junction near the surface of the device. In this way, the holes are collected within the absorption layer itself, and do not need to traverse any grading layers. While this design does require some post-growth diffusion, it also results in a more robust device characterized by still lower dark current. Notably, the multiplication region 103 is unaffected by the diffusion process, and, as in the prior case, is defined exclusively through the epitaxial growth process.

Also like the previous embodiment, the APD of FIG. 5 additionally comprises a peripheral ring electrode 115 for collecting carriers generated outside of the central, optically active region of the device.

Figure 6:
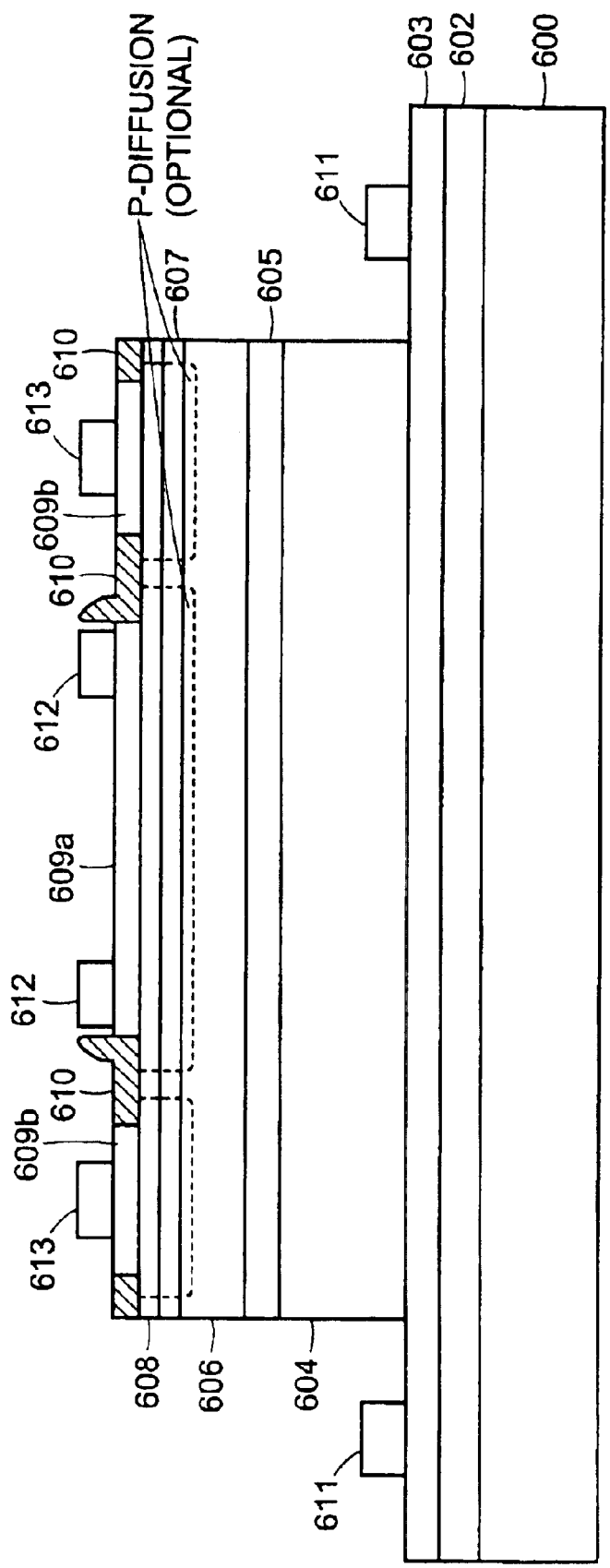
FIG. 6 is a cross-sectional schematic of a three-terminal p-type-intrinsic-n-type (PIN) diode according to the present invention.

In addition to the APD devices discussed above, the three-terminal structure may be employed for other types of photodetectors, including p-type-intrinsic-n-type (PIN) diodes. FIG. 6 illustrates one example of a three-terminal PIN diode with a dark current drain-ring according to the present invention. The PIN diode of FIG. 6 is constructed on an n+-type InP substrate 601. In succession above the substrate are provided an n+-type InP buffer layer 602 (e.g., 0.1–1 $\mu$m thick), and an n+-type InGaAsP layer 603 (e.g., 0.1–0.5 $\mu$m thick), which in this embodiment serves as the contact for the n-side electrode 611. Above this layer is formed a mesa structure including, in succession, an n+InP layer 604 (e.g., 0.1–0.5 $\mu$m thick), an undoped InP capacitance decoupling layer 605 (e.g. 0.1–0.5 $\mu$m thick), an undoped InGaAs absorption layer 606 (e.g., 0.5–2 $\mu$m thick), InGaAsP grading layer(s) 607 (e.g. 0.01–0.2 $\mu$m thick), an undoped InP passivation layer 608 (e.g., 0.1–0.5 $\mu$m thick), and a heavily p-doped contact layer 609 of InGaAs or InGaAsP (e.g. 0.1–0.5 $\mu$m thick). The contact layer 609 includes a central region 609a, corresponding to the optically active region of the device, concentrically surrounded by a peripheral ring area 609b, and the etched regions of the contact layer may be filled with a dielectric material 610.

Optionally, the PIN diode may include a p-type dopant (e.g. Zn) diffused through the passivation layer 608 and a short depth into the absorption layer 606. In this case, the grading layers 607 would be unnecessary.

One significant difference between the PIN structure and the APD discussed above is that the PIN does not include a high-gain multiplication region for promoting avalanche multiplication of the charge carriers. However, the operation of the PIN diode is otherwise very similar to the aforementioned APD. Charge carriers are generated in the absorption layer 605 in response to incident light. The carriers are swept towards opposite electrodes 610, 611 by the large applied reverse bias, thus producing a detectable electrical signal indicative of the incident radiation.

As shown in FIG. 6, the PIN diode may additionally comprise a third electrical terminal, or a peripheral ring electrode 612, in electrical contact with the peripheral region of the contact layer 608b. This third terminal acts to drain off dark current generated at the periphery of the diode, and thus improves the overall performance of the device.

According to yet another aspect, the present invention relates to a method for fabricating an avalanche photodiode (APD). As alluded to above, the multiple layer structure of the inventive APD can be formed using conventional epitaxial growth processes, including metalorganic chemical vapor deposition (MOCVD), or molecular beam epitaxy (MBE). These fabrication processes may be performed by, for instance, Epitaxial Technologies, LLC, of Baltimore, Md., or IQE of Cardiff, Wales, UK.

The mesa structure of the device can be formed in a conventional manner using masked etching, (dry or wet etching), dielectric patterning, and metallization patterning. A coating or passivation treatment may optionally be used on the exposed InP p-n junction. Connection to the device can be made from an isolated bond pad via an air bridge to keep the capacitance low (for high speed operation).

Although the embodiments shown here are all front-entry devices (meaning that the incident light impinges upon the photodiode at a surface opposite the substrate), the present invention also comprises rear-entry devices, where the optically active area is defined at the substrate layer.

While this invention has been particularly shown and described with references to preferred embodiments thereof, it will be understood by those skilled in the art that various changes in form and details may be made therein without departing from the scope of the invention encompassed by the appended claims.

What is claimed is:

1. An avalanche photodiode comprising:
   a substrate including a first semiconductor material;
   a multiplication layer above the substrate, the multiplication layer having an undoped region of a second semiconductor material;
   a dose layer over the multiplication layer, the dose layer having a doped region of a third semiconductor material;
   an absorbing layer that receives incident photons and generates charge carriers, the absorbing layer above the dose layer and having an undoped region of a fourth semiconductor material;
   at least one grading layer disposed between the absorbing layer and the dose layer to facilitate the transfer of carriers between the absorbing layer and the dose layer
   at least two electrical contacts that apply a voltage across the photodiode, wherein the at least one electrical contact is electrically connected to a top side of a contact layer, the contact layer comprising a doped semiconductor material of a first conductivity-type; and
   a passivation layer positioned adjacent to the bottom side of the contact layer, wherein the dopant of the contact layer is diffused through the passivation layer and partially into the absorbing layer.

2. The avalanche photodiode of claim 1 wherein at least one of the second, third, and fourth semiconductor materials are lattice matched to the substrate layer.

3. The avalanche photodiode of claim 1 wherein the multiplication layer and the dose layer comprise InAlAs.

4. The avalanche photodiode of claim 1 wherein the multiplication layer and the dose layer comprise InGaAs.

5. The avalanche photodiode of claim 1 wherein the multiplication layer and the dose layer comprise InP.

6. The avalanche photodiode of claim 1 wherein the thickness of the multiplication layer is approximately $0.4\,\mu m$ or less.

7. The avalanche photodiode of claim 1 wherein the absorbing layer comprises InGaAs.

8. The avalanche photodiode of claim 1 additionally comprising
   at least one grading layer disposed between the absorbing layer and the passivation layer to facilitate the transfer of carriers between the absorbing layer and the passivation layer.

9. The avalanche photodiode of claim 1 wherein a portion of the contact layer is removed to provide a central region of the contact layer.

10. An avalanche photodiode comprising:
    a substrate including a first semiconductor material;
    a multiplication layer above the substrate, the multiplication layer having an undoped region of a second semiconductor material;
    a dose layer over the multiplication layer, the dose layer having a doped region of a third semiconductor material;
    an absorbing layer that receives incident photons and generates charge carriers, the absorbing layer above the dose layer and having an undoped region of a fourth semiconductor material;
    at least one first grading layer disposed between the absorbing layer and the dose layer to facilitate the transfer of carriers between the absorbing layer and the dose layer
    at least two electrical contacts that apply a voltage across the photodiode, wherein the at least one electrical contact is electrically connected to a top side of a contact layer, the contact layer comprising a doped semiconductor material of a first conductivity-type;
    a passivation layer positioned adjacent to the bottom side of the contact layer;
    a field-stop layer adjacent to the multiplication layer, the field-stop layer comprising a doped semiconductor material of a second conductivity-type; and
    a buffer layer adjacent to the field-stop layer, the buffer layer comprising a heavily-doped region of the second conductivity type that is connected to a second electrical contact of the at least two electrical contacts, wherein the substrate comprises InP, the buffer layer comprises n-type Inp, the field stop layer comprises n-type InAlAs, the multiplication layer comprises undoped InAlAs, the dose layer comprises p-type InAlAs, the at least one first grading layer between the dose layer and the absorbing layer comprises undoped InGaAlAs, at least one undoped InP second grading layer positioned between the passivation layer and the absorbing layer, the absorbing layer comprises undoped InGaAs; the passivation layer comprises undoped InP or InGaAsP, and the contact layer comprises p-type InGaAs.

11. The avalanche photodiode of claim 9 additionally comprising a dielectric material disposed in the removed region of the contact layer.

12. The avalanche photodiode of claim 9 wherein a portion of the contact layer is removed to provide a central region of the contact layer and a peripheral region of the contact layer concentrically surrounding the central region.

13. The avalanche photodiode of claim 12 wherein the at least two electrical contacts comprises a third electrical contact electrically connected to the peripheral region of the contact layer.

14. A method of fabricating an avalanche photodiode comprising:

providing a substrate layer of a first semiconductor material;

forming a multiplication layer of a second semiconductor material over the substrate;

forming a doped dose layer of a third semiconductor material over the multiplication layer;

forming a light absorbing layer of a fourth semiconductor material over the dose layer;

forming a passivation layer;

forming a doped contact layer having a dopont, the doped contact layer disposed over the passivation layer, wherein the dopant of the contact layer is diffused through the passivation layer and partially into the light absorbing layer.

15. The method of claim 14 wherein at least one of the second, third, and fourth semiconductor materials are lattice matched to the substrate layer.

16. The method as described in claim 14 additionally comprising:

prior to the step of forming the light absorbing layer, forming at least one grading layer of semiconductor material over the doped dose layer; and forming the light absorbing layer over the at least one grading layer.

17. The method as described in claim 14 wherein the layers are formed by metalorganic chemical vapor deposition.

18. The method as described in claim 14 wherein the layers are formed by molecular beam epitaxy.

19. The method as described in claim 14 wherein the multiplication layer is formed via a growth process to a substantially uniform thickness that is approximately 4 $\mu$m or less.

20. The method as described in claim 19 wherein the thickness of the multiplication layer is controlled to within approximately 50 Angstoms.

* * * * *